United States Patent
Brug et al.

(10) Patent No.: US 9,806,258 B2
(45) Date of Patent: Oct. 31, 2017

(54) SUBSTRATE IMPRINTED WITH A PATTERN FOR FORMING ISOLATED DEVICE REGIONS

(71) Applicant: Applied Materials, Inc., Santa Clara, CA (US)

(72) Inventors: James A. Brug, Palo Alto, CA (US); Lihua Zhao, Palo Alto, CA (US); Carl A. Taussig, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 30 days.

(21) Appl. No.: 14/779,278

(22) PCT Filed: Mar. 29, 2013

(86) PCT No.: PCT/US2013/034610
§ 371 (c)(1),
(2) Date: Sep. 22, 2015

(87) PCT Pub. No.: WO2014/158187
PCT Pub. Date: Oct. 2, 2014

(65) Prior Publication Data
US 2016/0056379 A1    Feb. 25, 2016

(51) Int. Cl.
*H01L 51/00*    (2006.01)
*H01L 27/32*    (2006.01)
(Continued)

(52) U.S. Cl.
CPC ...... *H01L 51/0012* (2013.01); *H01L 27/3244* (2013.01); *H01L 27/3246* (2013.01);
(Continued)

(58) Field of Classification Search
CPC ... H01L 27/153; H01L 27/15; H01L 25/0753; H01L 33/20
See application file for complete search history.

(56) References Cited

U.S. PATENT DOCUMENTS 8,653,552 B2 *  2/2014  Kazama ............... H01L 33/382
                                                    257/100
2007/0042520 A1  2/2007  Oh et al.

FOREIGN PATENT DOCUMENTS

JP         08236867        9/1996
KR       100682255 B1      2/2007
(Continued)

OTHER PUBLICATIONS

International Search Report dated Dec. 30, 2013 for Application No. PCT/US2013/034610.

*Primary Examiner* — Quoc Hoang
(74) *Attorney, Agent, or Firm* — Patterson + Sheridan LLP

(57) ABSTRACT

An example provides a method for forming an apparatus including a substrate imprinted with a pattern for forming isolated device regions. A method may include imprinting an unpatterned area of a substrate with a pattern to form a patterned substrate having a plurality of recessed regions at a first level and a plurality of elevated regions at a second level, and depositing a first layer of conductive material over the patterned substrate with a plurality of breaks to form a plurality of bottom electrodes. The method may include depositing a layer of an active stack, with a second layer of conductive material, over the plurality of bottom electrodes to form a plurality of devices on the plurality of recessed regions isolated from each other by the plurality of elevated regions.

13 Claims, 14 Drawing Sheets

(51) Int. Cl.
  *H01L 51/56* (2006.01)
  *H01L 51/50* (2006.01)
  *H01L 51/52* (2006.01)

(52) U.S. Cl.
  CPC ...... *H01L 27/3276* (2013.01); *H01L 51/0004* (2013.01); *H01L 51/0096* (2013.01); *H01L 51/0021* (2013.01); *H01L 51/0024* (2013.01); *H01L 51/5012* (2013.01); *H01L 51/5203* (2013.01); *H01L 51/56* (2013.01); *H01L 2227/323* (2013.01); *H01L 2251/105* (2013.01); *Y02P 70/521* (2015.11)

(56) References Cited

FOREIGN PATENT DOCUMENTS

| | | |
|---|---|---|
| KR | 1020080023820 | 3/2008 |
| KR | 101049158 B1 | 7/2011 |

* cited by examiner

SUBSTRATE IMPRINTED WITH A PATTERN FOR FORMING ISOLATED DEVICE REGIONS

BACKGROUND

Electronic devices are sometimes fabricated with intricately patterned complex film stacks of organic or reactive materials. Organic light-emitting diode displays, for example, may be made from thin layers of organic and reactive materials such as calcium, barium, and cesium fluoride, among others. To form the electronic devices, active devices of these complex film stacks commonly must be aligned with other components of a circuit.

BRIEF DESCRIPTION OF THE DRAWINGS

The detailed description section references the drawings, wherein.

DETAILED DESCRIPTION OF EMBODIMENTS

Processes for fabricating electronic devices sometimes involve patterning techniques. Lithography, for example, uses photoresist patterns that need to be deposited, patterned, and subsequently removed, but this sort of lithography can be damaging to the materials of the devices. Shadow masking may involve depositing material through the holes of a mask having a pattern of holes in a mechanically robust film, and then subsequently removing the mask. But this latter method commonly has low resolution, making scaling to micro- or nano-scale difficult, has poor alignment capability over larger areas, especially on flexible substrates, and can be damaging to the substrate because of mechanical contact. High resolution masks may also be expensive to make and difficult to handle and to reuse the very thin mask. Moreover, photoresist-based lithography and shadow masking may not be suitable for roll-to-roll fabrication where a continuous process is used.

Other fabrication processes may be suitable for roll-to-roll fabrication but nevertheless may face issues due to the sensitive device materials. Process-sensitive materials may include thin films of organic or reactive materials used in new types of displays, memory, or sensors, for example. Forming complex stacks of process-sensitive materials may require carefully controlled interfaces for high performance and mechanical adhesion, which may prohibit disruption of the film stack by patterning or laminating either during or after deposition of all the layers of the stack.

In some cases, electronic devices may require alignment of the active devices with other components of the circuit. Alignment, especially for fabrication on flexible substrates, may be problematic because of the variation in dimensions that may result from processing. This may be a greater issue for roll-to-roll fabrication wherein a rigid carrier may not be used.

Described herein are embodiments of methods for making apparatuses and systems with a substrate imprinted with a pattern for forming isolated regions of an active stack. Various implementations may be suitable for forming devices from materials sensitive to exposure to typical patterning operations. Moreover, in various implementations, the isolated regions of the active stack may facilitate alignment to drive circuitry, or may avoid the need for alignment altogether. Various implementations may be especially suitable for low-cost manufacturing of arrays of micro- or nano-scale devices using roll-to-roll imprinting.

Figure 1:
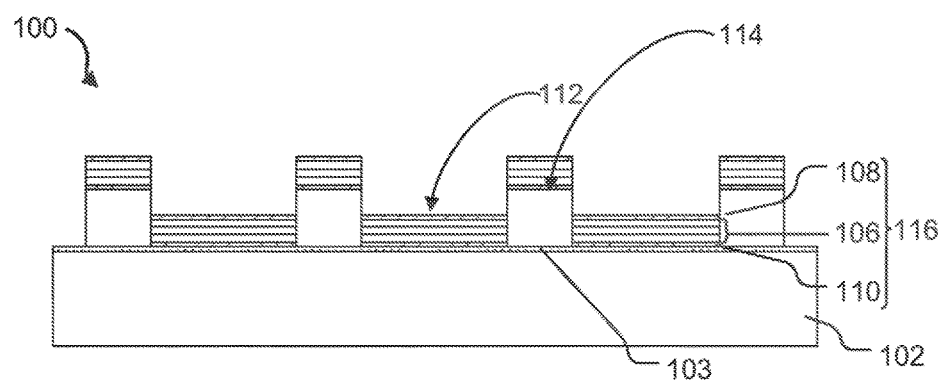
FIG. 1 illustrates an example apparatus including a patterned substrate with isolated devices, in accordance with various implementations.

Turning now to FIG. 1, illustrated is an example apparatus 100 including a substrate 102 may include a layer of conductive material 103 and may include at least an area imprinted with a pattern of a plurality of recessed regions 112 at a first level and a plurality of elevated regions 114 at a second level. In various implementations, the plurality of recessed regions 112 and elevated regions 114 may be formed above a layer of conductive material 103. The apparatus 100 may include isolated regions of an active stack 106, and a layer of conductive material 108 on the regions of the active stack 106. The isolated regions of the active stack 106 may be formed on a layer of conductive material 110. The regions of the active stack 106 may be formed on the recessed regions 112 or the recessed regions 112 and the elevated regions 114, as shown. The regions of the active stack 106 on the recessed regions 112 may be physically isolated from each other by the elevated regions 114 as shown, with the layer of conductive material 103 contacting the regions of the active stack 106 in the recessed regions 112 together, forming a common or grounding layer. In various implementations, the regions of the active stack 106 on the elevated regions may be unconnected as a byproduct of the fabrication of the isolated regions of the active stack 106.

The layer of conductive material 108, 110 may comprise electrodes such that the plurality of isolated regions of the active stack 106 with the layers of conductive material 108, 110 may form a corresponding plurality of isolated devices 116. In various implementations, the devices 116 may be devices such as, for example, switches formed at junctions of cross-bar architectures or vertically-oriented two-terminal devices with the layers of conductive material 108, 110 forming the terminals. Vertically-oriented two-terminal devices may include devices such as, but not limited to, diodes, switches, memristors, and capacitors. In various implementations, the devices 116 may be devices that may be addressed by arrays of transistors. In some implementations, for example, the devices 116 may be organic light-emitting diodes (OLED) for forming OLED displays or arrays for solid-state lighting. In some implementations, the devices 116 may be storage or memory arrays comprising memristors or non-volatile switches such as, for example, molecular switches. In some implementations, the devices 116 may form a sensor array such as, for example, image, x-ray, or radiation sensors.

The active stack 106 may comprise one or more layers for forming the devices 116. For implementations in which the devices comprise OLEDs, for example, the active stack 106 may comprise an organic light-emitting diode stack. In some implementations, an organic light-emitting diode stack may comprise at least an emissive layer.

The layers of conductive material 103, 108, 110 may comprise any conductive material suitable for forming a common/ground layer and top and bottom electrodes, respectively, for the isolated devices 116. In various implementations, the layer of conductive material 110 may comprise a conductive material selected from metal oxides (such as, e.g., indium tin oxide, etc.), metals, graphite, and combinations thereof. In various implementations, the layer of conductive material 108 may comprise a conductive material selected from aluminum, silver, gold, and combinations thereof. In various implementations, the layer of conductive material 103 may comprise a conductive material selected from metal oxides (such as, e.g., indium tin oxide, etc.), metals, graphite, aluminum, silver, gold, and combinations thereof.

By forming the devices 116 using a patterned substrate 102 having recessed regions 112 and elevated regions 116, the devices 116 may be formed so that the devices 116 are isolated from each other without post-processing such as wet or dry etching operations to isolate the devices 116. By virtue of this self-isolation, various implementations may be especially suited for roll-to-roll manufacturing and/or making arrays of micro- or nano-scale devices. In various implementations, because the devices 116 are isolated when formed, the devices 116 may be laminated to drive circuitry (such as, e.g., an electronic backplane with electrodes) without alignment or with minimal alignment as compared to non-self-isolating devices.

Figure 2:
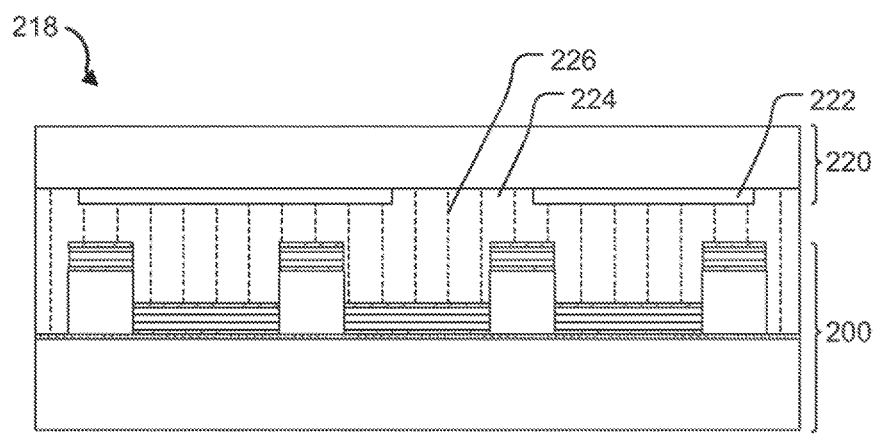
FIG. 2 illustrates an example system including a patterned substrate with isolated devices, in accordance with various implementations.

FIG. 2 illustrates an example system 218 including an apparatus 200, which in some implementations may be an apparatus like the apparatus 100 described herein with reference to FIG. 1, including a patterned substrate 202 and a plurality of isolated devices 216. The electronic device 200 may include devices 216 bonded to another substrate. In various implementations, the other substrate may comprise an electronic backplane 220 having a plurality of electrodes 222 to drive the devices 216. In various implementations, the electronic device 200 may be a display. The display may be a rigid or flexible display. Examples of display may include, but are not limited to, light-emitting diode displays, organic light-emitting diode displays, active-matrix organic light-emitting diode displays, passive-matrix organic light-emitting diode displays, among others.

In various implementations, the devices 216 may be laminated to the electronic backplane 220 using an adhesive 224. The adhesive 224 may comprise an adhesive embedded with anisotropic conductors 226 that allow a high current to flow from one side to the other in the Z-direction (e.g., between the devices 216 and the electronic backplane 220), but substantially block current flow across the adhesive 224 to maintain electrical isolation of the devices 216. Example adhesives may include, but are not limited to, ZTACH®, available from SunRay Scientific LLC, Mount Laurel, N.J., USA, or an anisotropic conductive film (ACF) adhesive film from 3M®, St. Paul, Minn., USA. In some implementations, the adhesive 224 may comprise a conductive adhesive patterned or printed along with the electronic backplane 220.

Various operations of methods for forming an apparatus including a patterned substrate with isolated devices, or a system including such an apparatus, is illustrated in FIGS. 3-15 by way of cross-sectional side views of the apparatus at various stages of the methods. It should be noted that various operations discussed and/or illustrated may be generally referred to as multiple discrete operations in turn to help in understanding various implementations. The order of description should not be construed to imply that these operations are order dependent, unless explicitly stated. Moreover, some implementations may include more or fewer operations than may be described.

Figure 3:
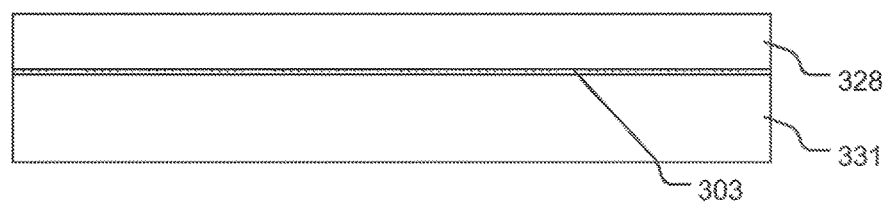
FIGS. 3-15 illustrate various stages of methods for forming an apparatus with a patterned substrate with isolated devices, in accordance with various implementations.
Figure 4:
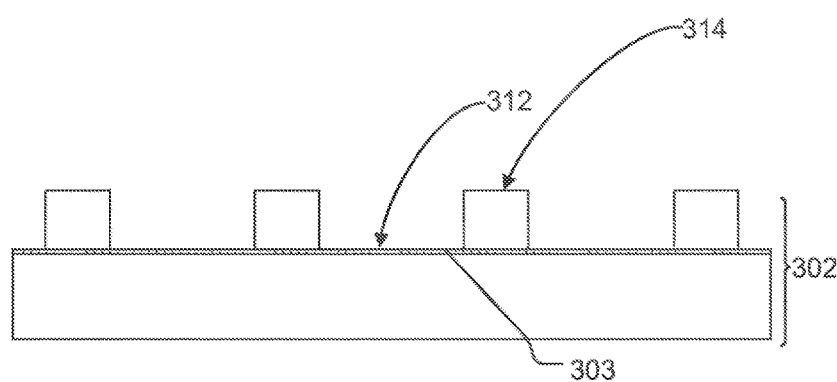
Figure 5:
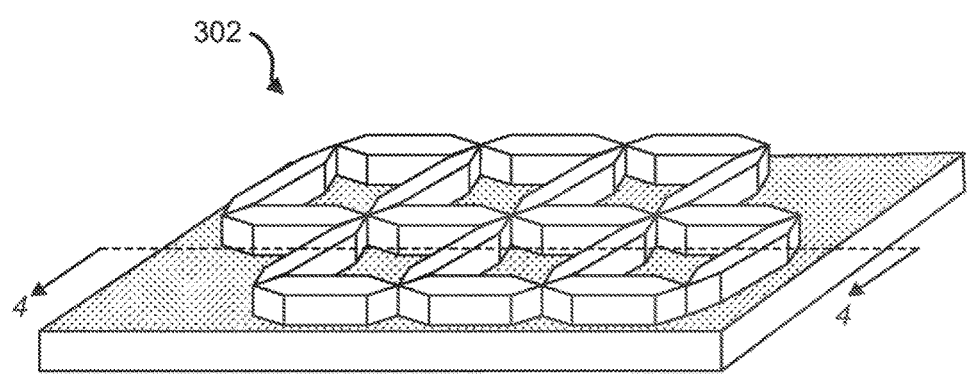

Turning now to FIG. 3, a method for forming an apparatus with isolated devices on a patterned substrate may begin or proceed with a starting material 328 having a layer of conductive material 303. The conductive material 303 may be on another substrate, which may be the same or different material than the starting material 328. The starting material 328 may be patterned to form a substrate 302 with elevated regions 314 and recessed regions 312, as illustrated in FIGS. 4 and 5, with the layer of conductive material 303 exposed in the recessed regions 312. For various implementations described herein, the substrate 302 may be formed of any of a number of flexible and rigid materials. In various implementations, the substrate 302 may comprise a dielectric material. In some implementations, the substrate 302 may comprise a flexible material such as, but not limited to, polyesters, polyimides, polyacrylates, polycarbonates, silicones, other organic or inorganic polymers, and combinations thereof. The starting materials 328 for flexible substrates may be processed in an extruder to form a sheet or roll of substrate. In some implementations, the substrate 302 may comprise a rigid material such as, but not limited to, glass, quartz, sapphire, rigid plastics, and combinations thereof.

The substrate 302 may be patterned using any process that produces steep walls. In various implementations, the substrate 302 may be patterned using imprint lithography or stamping. In other implementations, the substrate 302 may be patterned using another type of etching operation such as, for example, laser etching, photolithography, wet or dry etching, among others.

Figure 6:
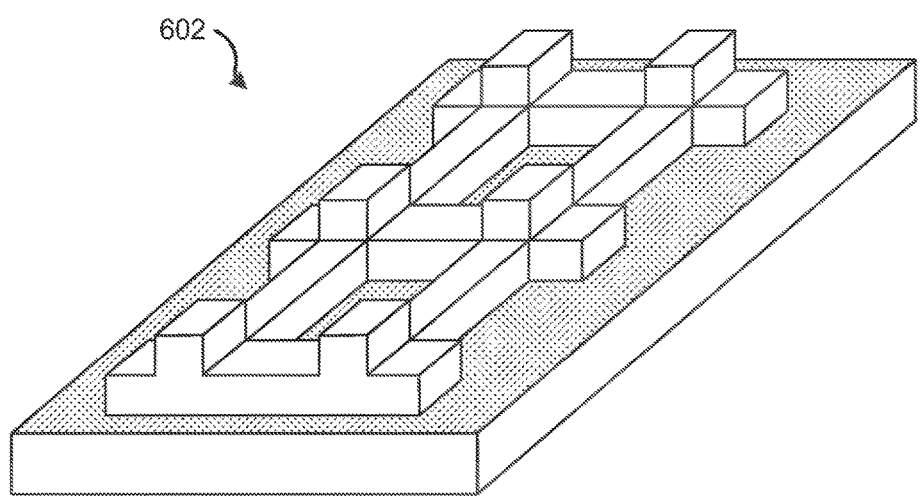

The substrate 302 may be patterned with a pattern that fragments the substrate in a manner such that physically isolated device regions may be formed. In various implementations, such a pattern may include two levels as illustrated for the substrate 302 in FIGS. 4 and 5, or more levels for the substrate 602 as illustrated in FIG. 6.

Figure 7:
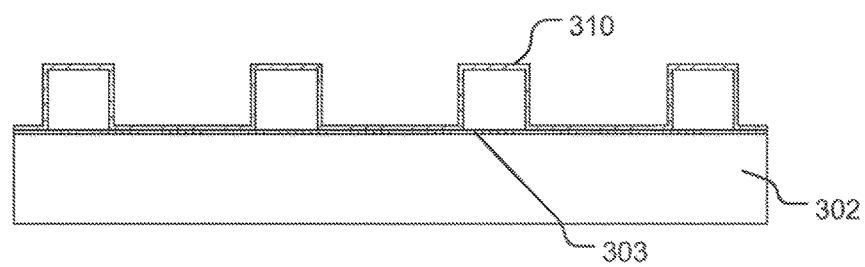

As illustrated in FIG. 7, a layer of conductive material 310 may be formed on the substrate 302. As noted herein, the layer of conductive material 310 may form a bottom electrode of the devices to be fabricated and which may be contacted with one or more other devices by the layer of conductive layer 303. In various implementations, the layer of conductive material 310 may comprise a conductive material selected from metal oxides (such as, e.g., indium tin oxide, etc.), metals, graphite, and combinations thereof. The layer of conductive material 310 may be formed using vacuum deposition, chemical vapor deposition, or any of a number of other deposition operations.

Figure 8:
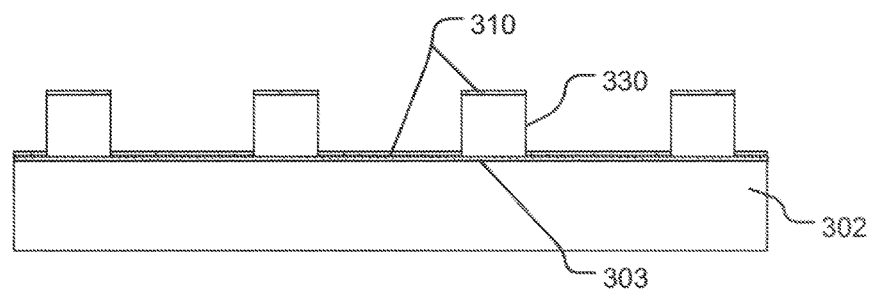

In order to form isolated devices, a plurality of breaks in the layer of conductive material 310 may need to be formed to form isolated regions of the layer of conductive material 310. As illustrated in FIG. 8, breaks in the layer of conductive material 310 may be formed on at least one of the sidewalls 330 of the elevated regions 314 of the substrate 302. In various implementations, the breaks in the layer of conductive material 310 may be formed by etching to remove the conductive material 310 from at least one of the sidewalls 330.

An active stack may then be deposited or coated onto the substrate 302 having the broken layer of conductive material 310 to form an apparatus similar to the apparatus 100 illustrated in FIG. 1. In various implementations, the active stack with the layer of conductive material 108 may be formed by spin coating, blade coating, evaporation, or another operation. In various implementations, the active stack 106 with the layer of conductive material 108 may be pre-formed and deposited simultaneously onto the layer of conductive material 110, or may be deposited in turn to form the isolated devices 116.

Figure 9:
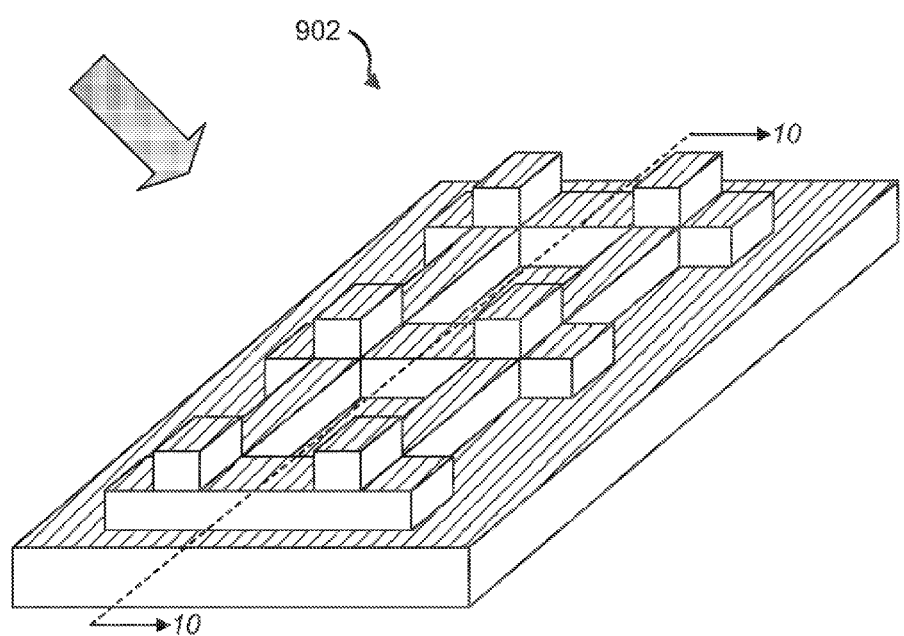
Figure 10:
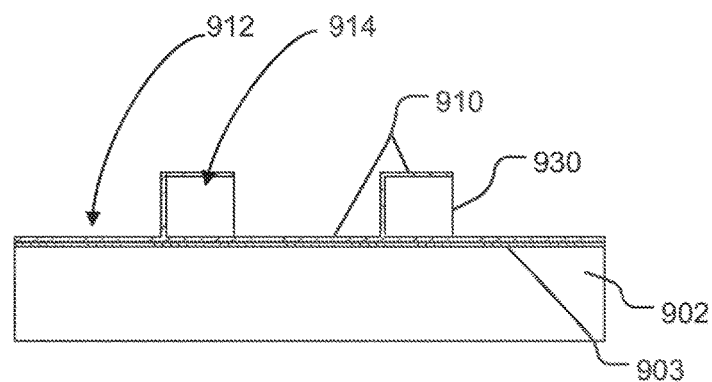
Figure 11:
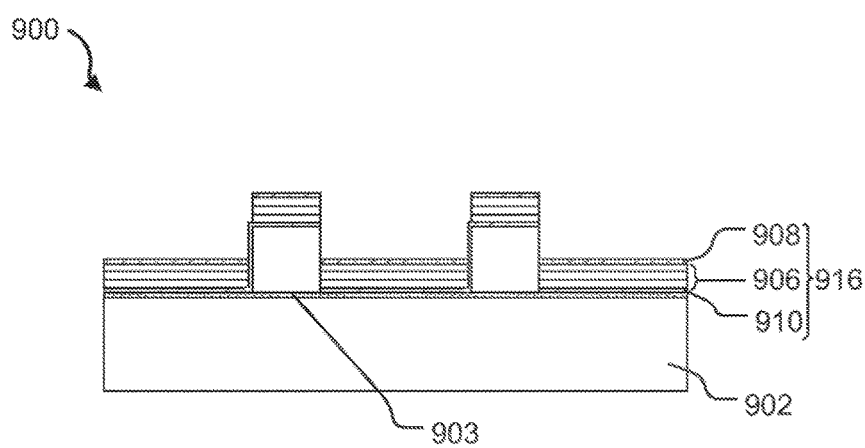

FIGS. 9-11 illustrate another example of forming a layer of conductive material 910 with breaks for forming isolated devices. As shown in FIG. 9, the layer of conductive material 910 may be formed by depositing the layer of conductive material 910 at an angle with respect to a major surface of the substrate 902. As shown in FIG. 10, the substrate 902 may include a layer of conductive material 903 and may be imprinted with a pattern having elevated regions 914 and recessed regions 912. As also shown in FIG. 10, depositing the layer of conductive material 910 at an angle may result in some of the sidewalls 930 of the elevated regions 914 are shadowed and not coated with the layer of conductive material 910. In various implementations, a shadowed sidewall 930 between recessed regions 912 may ensure that the breaks are formed in the layer of conductive material 910 so that isolated devices may be formed as described herein. An active stack 906 and another layer of conductive material 908 may then be deposited or coated onto the substrate 902 having the broken layer of conductive material 910, as shown in FIG. 11. In various implementations, the active stack 906 with the layer of conductive material 908 may be formed by spin coating, blade coating, evaporation, or another operation. In various implementations, the active stack 906 with the layer of conductive material 908 may be pre-formed and deposited simultaneously onto the layer of conductive material 910, or may be deposited in turn to form an apparatus 900 including isolated devices 916.

Figure 12:
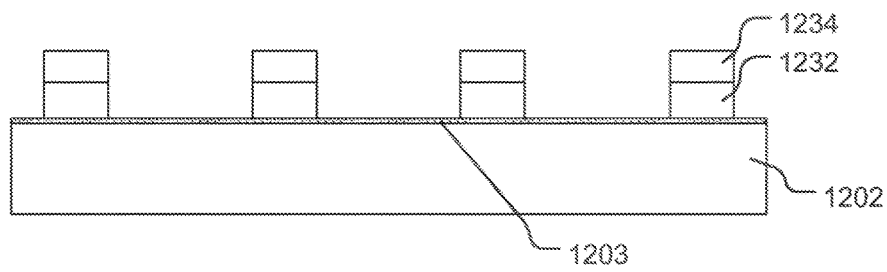
Figure 13:
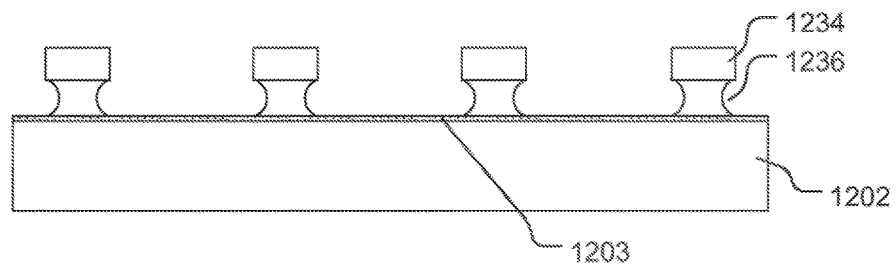

FIGS. 12-15 illustrate yet another example of forming a layer of conductive material 1210 with breaks for forming an apparatus 1200 with isolated devices 1216. As shown in FIG. 12, the substrate 1202 may include a layer of conductive material 1203 and a bilayer pattern having a first layer of dielectric material 1232 and a second layer of dielectric material 1234 on the first layer of dielectric material 1232. A plurality of undercuts 1236 may be formed in the first layer of dielectric material 1232, as shown in FIG. 13. In various implementations, the undercuts 1236 may be formed by an etch operation, and in at least some of these implementations, the first layer of dielectric material 1232 may be formed of a material having an etch rate that is faster than an etch rate of the second layer of dielectric material 1234.

Figure 14:
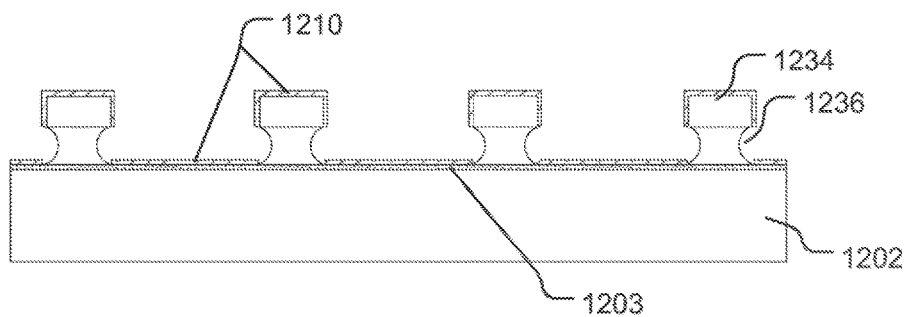
Figure 15:
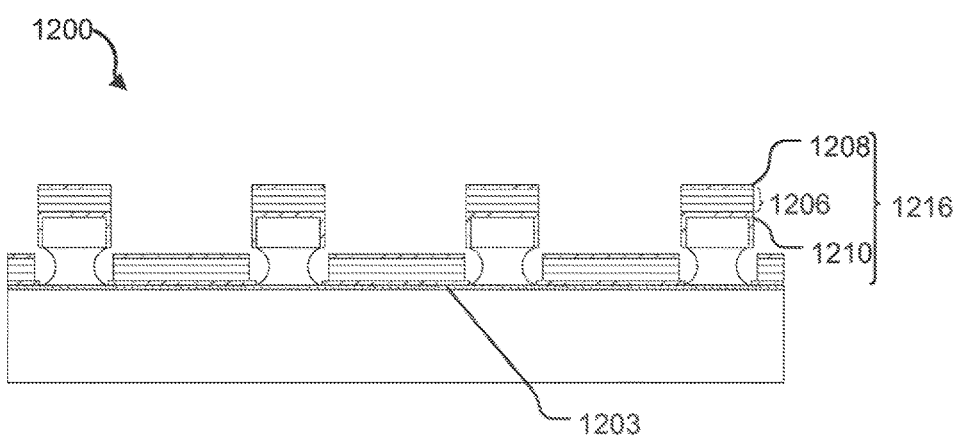

After forming the undercuts 1236, a layer of conductive material 1210 may be formed on the substrate 1202, as illustrated in FIG. 14. As shown, the undercuts 1236 result in breaks in the layer of conductive material such that when the active layer 1206 and the other layer of conductive material 1208 is formed over the substrate 1202, as shown in FIG. 15, isolated devices 1216 are formed.

Figure 16:
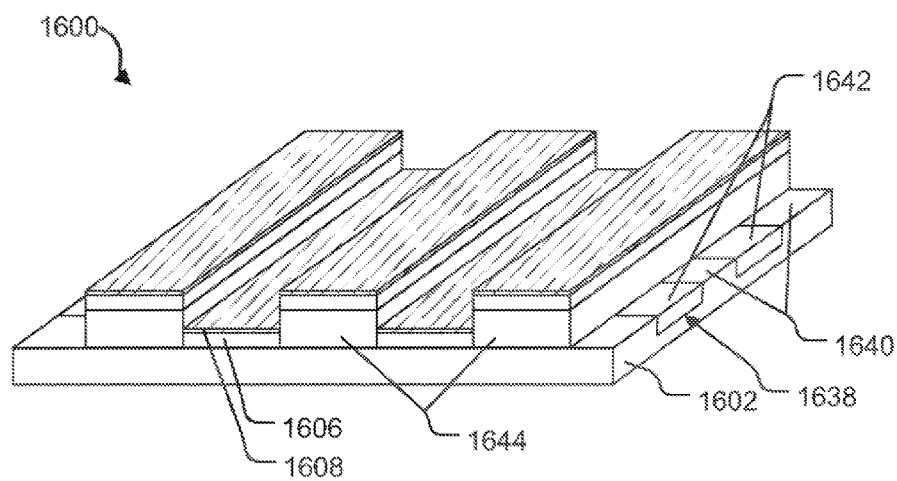
FIG. 16 illustrates another example apparatus including a patterned substrate with isolated devices, in accordance with various implementations.

As noted herein, an apparatus in accordance with various implementations may comprise switches formed at junctions of cross-bar architectures. FIG. 16 illustrates an example apparatus 1600 including a cross-bar architecture. As shown, the substrate 1602 may comprise a plurality of lines of recessed regions 1638, and a plurality of lines of elevated regions 1640. A layer of conductive material may be formed in the recessed regions 1638 as shown, forming a plurality of isolated conductive lines 1642. The apparatus 1600 may further include a plurality of printed lines of dielectric material 1644 on the substrate 1602 and extending perpendicularly with respect to the plurality of conductive lines 1642. In various implementations, the lines of dielectric material 1644 may be imprinted using an imprint lithography operation or other patterning operation. For example, in some implementations, a blanket layer of dielectric material may be formed over the substrate and then patterned to form the structure shown in FIG. 16. An active stack 1608 and layer of conductive material 1610 may then be deposited or coated onto the substrate 1602 to form an apparatus in which devices are formed at the intersections of the conductive lines 1642 and the active stack 1606.

Figure 17:
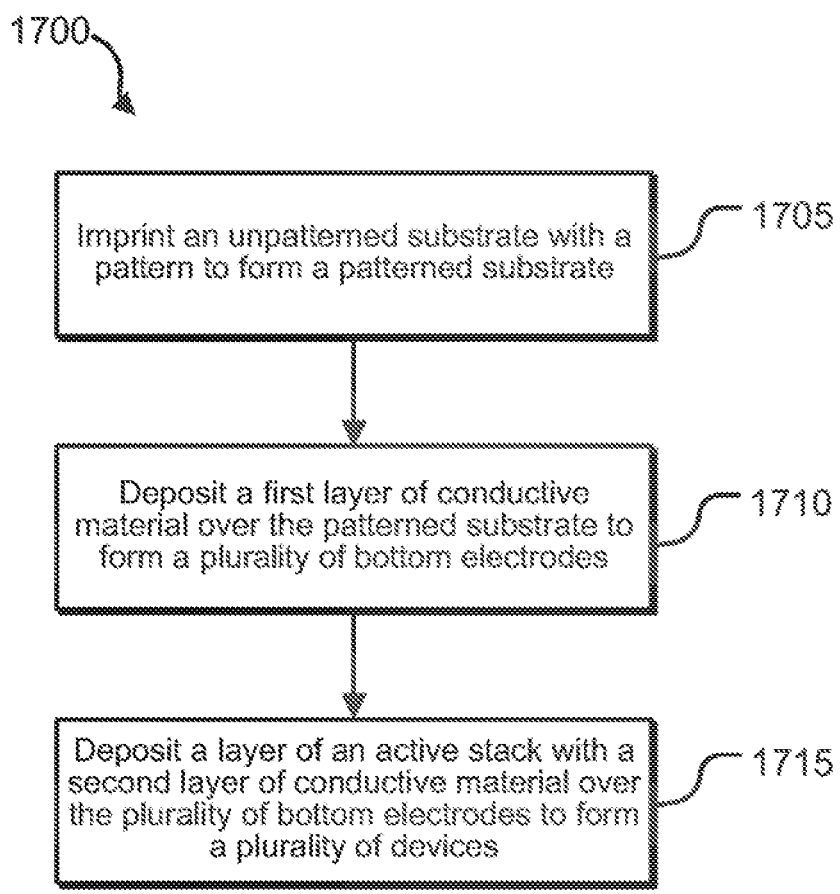
FIG. 17 is a flow diagram of an example method for making an apparatus including a patterned substrate with isolated devices, in accordance with various implementations.
Figure 18:
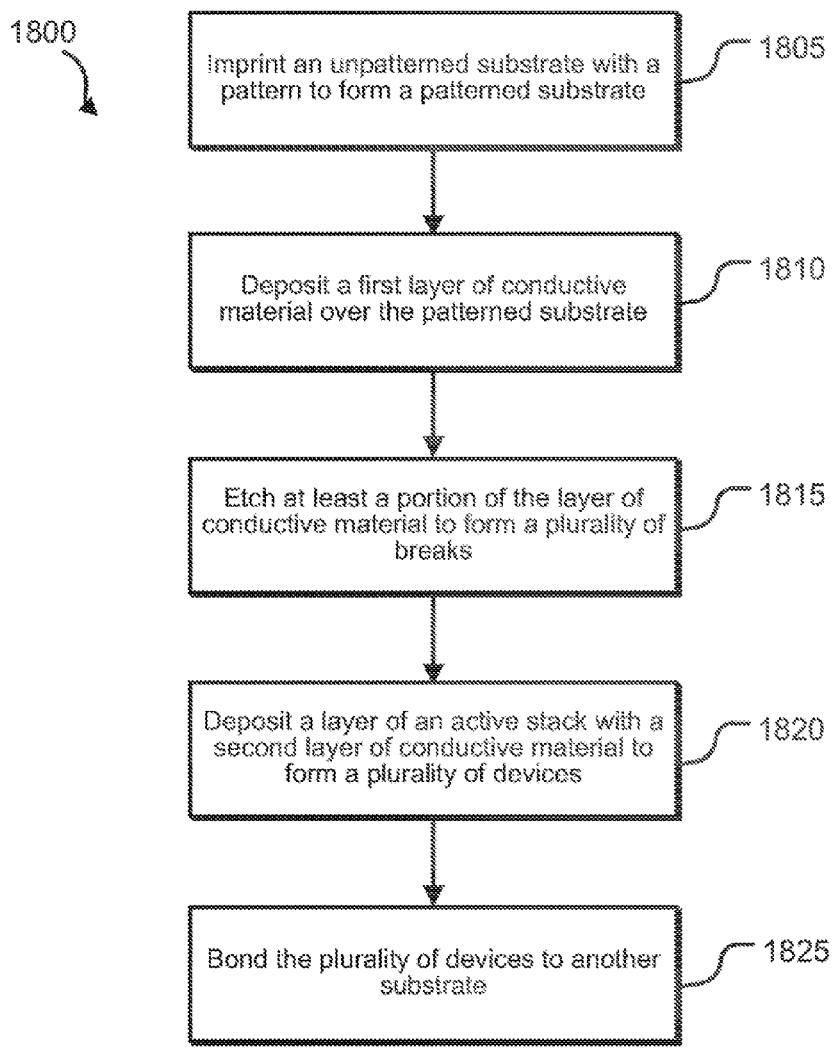
FIG. 18 is a flow diagram of another example method for making an apparatus including a patterned substrate with isolated devices, in accordance with various implementations.
Figure 19:
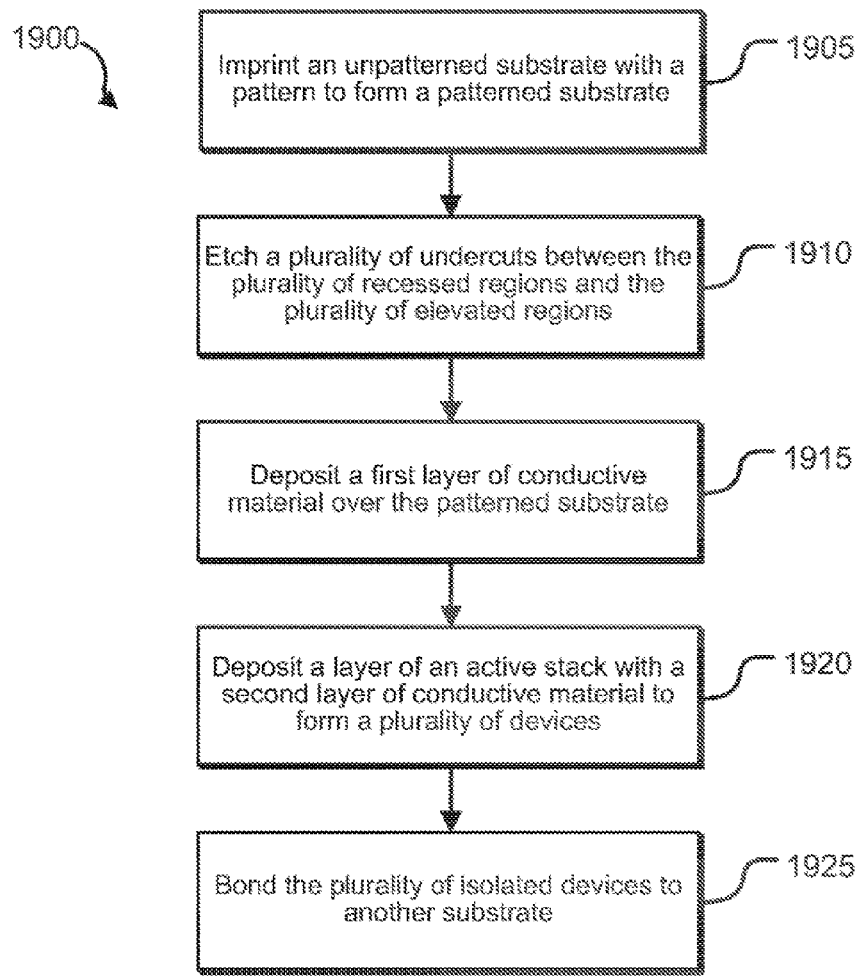
FIG. 19 is a flow diagram of another example method for making an apparatus including a patterned substrate with isolated devices, in accordance with various implementations.

Flow diagrams describing various methods for making an apparatus including a patterned substrate with isolated device regions, in accordance with various implementations, are illustrated in FIGS. 17-19. While the flow diagrams illustrate various operations in a particular order, the drawings are not intended to limit the present disclosure to any particular order. Additionally, the drawings are not intended to imply that all operations are required for all implementations.

Turning now to FIG. 17, processing for the method 1700 may begin or proceed with imprinting an area of a substrate with a pattern, at block 1705. In various examples, the substrate may be imprinted with a pattern having a plurality of recessed regions at a first level and a plurality of elevated regions at a second level. In various examples, the imprinting may comprise roll-to-roll imprinting of the substrate to form the pattern. In various implementations, the substrate may include a layer of conductive material for providing a common or ground layer. The layer of conductive material may be exposed by the recessed regions of the pattern.

The method 1700 may proceed with depositing a first layer of conductive material on the patterned substrate with a plurality of breaks to form a plurality of bottom electrodes, at block 1710. In various examples, the layer of conductive material may comprise a conductive material selected from metal oxides (such as, e.g., indium tin oxide, etc.), metals, graphite, and combinations thereof. The layer of conductive material may be formed using vacuum deposition, chemical vapor deposition, or any of a number of other deposition operations.

The method 1700 may proceed with depositing a layer of an active stack, with a second layer of conductive material, over the plurality of bottom electrodes, at block 1715. In various examples, the bottom electrodes and the active stack having the second layer of conductive material may form, at least in part, a corresponding plurality of isolated devices. In various ones of these examples, the second layer of conductive material may form a top electrode for a device. The second layer of conductive material may comprise a conductive material selected from aluminum, silver, gold, and combinations thereof. The second layer of conductive material may be formed using vacuum deposition, chemical vapor deposition, or any of a number of other deposition operations.

FIG. 18 describes another example method 1800. The method 1800 may begin or proceed with imprinting an area of a substrate with a pattern, at block 1805. In various examples, the substrate may be imprinted with a pattern having a plurality of recessed regions at a first level and a plurality of elevated regions at a second level. In various examples, the imprinting may comprise roll-to-roll imprinting of the substrate to form the pattern. In various implementations, the substrate may include a layer of conductive material for providing a common or ground layer. The layer of conductive material may be exposed by the recessed regions of the pattern.

The method 1800 may proceed with depositing a first layer of conductive material on the patterned substrate, at block 1810. In various examples, the layer of conductive material may comprise a conductive material selected from metal oxides (such as, e.g., indium tin oxide, etc.), metals, graphite, and combinations thereof. The layer of conductive material may be formed using vacuum deposition, chemical vapor deposition, or any of a number of other deposition operations.

The method 1800 may proceed with etching at least a portion of the layer of conductive material to form the plurality of breaks, at block 1815. In various examples, the plurality of breaks form a plurality of isolated conductive regions of the layer of conductive material.

In some implementations, the operation at block 1810 may comprise depositing the layer of conductive material at an angle with respect to a major surface of the patterned substrate such that at least some of the surface of the patterned substrate is not coated with the layer of conductive material. In various examples, the uncoated areas of the patterned substrate may form the plurality of breaks for forming the plurality of isolated conductive regions of the layer of conductive material. In various ones of these implementations, the operation at block 1815 may be omitted.

The method 1800 may proceed with depositing a layer of an active stack, with a second layer of conductive material, on the plurality of isolated conductive regions to form a plurality of isolated devices, at block 1820. In various examples, the layer of the active stack may be deposited on the plurality of isolated conductive regions to form a plurality of regions of the active stack on the plurality of recessed regions of the patterned substrate isolated from each other by the plurality of elevated regions. The second layer of conductive material may comprise a conductive material selected from aluminum, silver, gold, and combinations thereof. The second layer of conductive material may be formed using vacuum deposition, chemical vapor deposition, or any of a number of other deposition operations.

The method 1800 may proceed with bonding the plurality of isolated devices to another substrate, at block 1825. In various implementations, the other substrate may comprise an electronic backplane having a plurality of electrodes to drive the isolated devices. In various examples, the plurality of isolated devices may be laminated to another substrate using a conductive adhesive. The adhesive may comprise an adhesive embedded with anisotropic conductors that allow a high current to flow from one side to the other in the Z-direction (e.g., between the isolated devices and the other substrate), but substantially block current flow across the adhesive to maintain electrical isolation of the devices.

FIG. 19 describes another example method 1900. The method 1900 may begin or proceed with imprinting an area of a substrate with a pattern, at block 1905. In various examples, the substrate may be imprinted with a pattern having a plurality of recessed regions at a first level and a plurality of elevated regions at a second level. In various examples, the imprinting may comprise roll-to-roll imprinting of the substrate to form the pattern. In various implementations, the substrate may include a layer of conductive material for providing a common or ground layer. The layer of conductive material may be exposed by the recessed regions of the pattern.

The method 1900 may proceed with etching a plurality of undercuts between the plurality of recessed regions and the plurality of elevated regions, at block 1910. In various examples, the patterned substrate may include a first layer of dielectric material and a second layer of dielectric material on the first layer of dielectric material, the first layer of dielectric material having an etch rate that is faster than an etch rate of the second layer of dielectric material such that the undercuts may be formed during the etch operation.

The method 1900 may proceed with depositing a first layer of conductive material on the patterned substrate, at block 1915. In various examples, the first layer of conductive material may not be deposited on the plurality of undercuts at least by virtue of the structure having an overhang that effectively blocks deposition of the conductive material into the undercut areas, thereby forming breaks in the first layer of conductive material, resulting in a plurality of isolated conductive regions. In various examples, the layer of conductive material may comprise a conductive material selected from metal oxides (such as, e.g., indium tin oxide, etc.), metals, graphite, and combinations thereof. The layer of conductive material may be formed using vacuum deposition, chemical vapor deposition, or any of a number of other deposition operations.

The method 1900 may proceed with depositing a layer of an active stack, with a second layer of conductive material, over the plurality of bottom electrodes, at block 1920. In various examples, the layer of the active stack may be deposited on the plurality of isolated conductive regions to form a plurality of regions of the active stack on the plurality of recessed regions of the patterned substrate isolated from each other by the plurality of elevated regions. In various examples, the plurality of isolated regions of the active stack on the plurality of isolated conductive regions and having the second layer of conductive layer may form, at least in part, a corresponding plurality of isolated devices. In various ones of these examples, the second layer of conductive material may form a top electrode for a device. The second layer of conductive material may comprise a conductive material selected from aluminum, silver, gold, and combinations thereof. The second layer of conductive material may be formed using vacuum deposition, chemical vapor deposition, or any of a number of other deposition operations.

The method 1900 may proceed with bonding the plurality of isolated devices to another substrate, at block 1925. In various implementations, the other substrate may comprise an electronic backplane having a plurality of electrodes to drive the isolated devices. In various examples, the plurality of isolated devices may be laminated to another substrate using a conductive adhesive. The adhesive may comprise an adhesive embedded with anisotropic conductors that allow a high current to flow from one side to the other in the Z-direction (e.g., between the isolated devices and the other substrate), but substantially block current flow across the adhesive to maintain electrical isolation of the devices.

Figure 20:
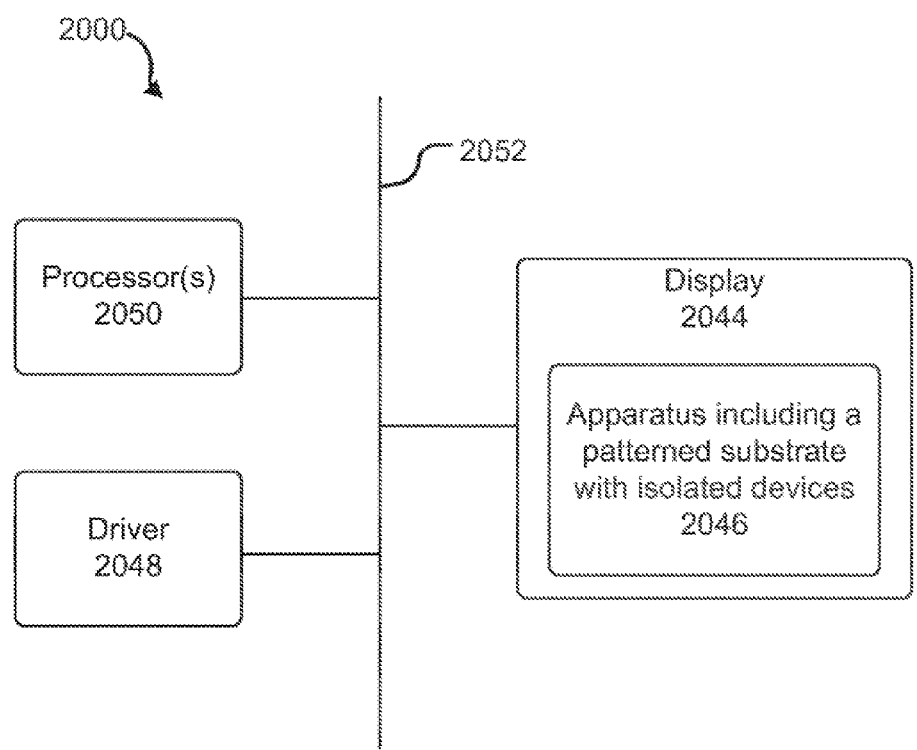
FIG. 20 illustrates an example system including a patterned substrate with isolated devices, in accordance with various implementations.

The various apparatuses described herein may be stand-alone devices or may be Incorporated into various types of systems such as system 2000 illustrated in FIG. 20. In various implementations, system 2000 may be system such as, but not limited to, desktop computers, notebook computers, handheld computers, tablet computers, netbook computers, convertible computers, display devices, servers, set-top boxes, digital recorders, game consoles, smart phones, personal digital assistants, mobile phones, digital media players, televisions, or digital cameras.

The system 2000 may include a display 2044 having an apparatus 2046 having substrate imprinted with a pattern forming isolated devices, in accordance with various implementations described herein (such as, e.g., apparatus 100 of FIG. 1, apparatus 900 of FIG. 11, apparatus 1200 of FIG. 15, apparatus 1600 of FIG. 16, etc.). In various implementations, the apparatus 2046 may comprise a plurality of diodes on a substrate including two or more levels, a first layer of conductive material over the patterned substrate with a plurality of breaks forming a plurality of bottom electrodes, and a plurality of regions of an active stack, each region including a top electrode formed of a second layer of conductive material on the plurality of bottom electrodes. The apparatus 2046 may include an electronic backplane bonded to the plurality of diodes.

The display 2044 may comprise a rigid or flexible display. In various implementations, the display 2044 may be a light-emitting diode display, an organic light-emitting diode display, an active-matrix organic light-emitting diode display, a passive-matrix organic light-emitting diode display, or another type of display.

The system 2000 may include a display driver 2048 and one or more processors 2050, operatively coupled to the display 2044 by a bus 2052. In various implementations, the processor(s) 2050 may access a storage system of the system 2000 to obtain code configured to direct the processor(s) 2050 to obtain data over the bus 2052 and provide the data to the display driver 2048 for rendering on the display 2044. Though not illustrated, in some implementations, the system 2000 may include memory, I/O devices, user controls, memory and I/O controllers, communications interfaces, etc.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific numbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments.

The phrases "in an example," "in various examples," "in some examples," "in various embodiments," and "in some embodiments" are used repeatedly. The phrases generally do not refer to the same embodiments; however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A. B and C). The phrase "(A) B" means (B) or (A and B), that is, A is optional.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. An apparatus comprising:
   a patterned substrate having a plurality of recessed regions at a first level and a plurality of elevated regions at a second level;
   a first layer of conductive material over the plurality of recessed regions and the plurality of elevated regions with a plurality of breaks forming a plurality of bottom electrodes; and
   a plurality of regions of an active stack, each region including a top electrode formed of a second layer of conductive material, on the plurality of bottom electrodes and isolated from each other by the plurality of elevated regions.

2. The apparatus of claim 1, wherein the plurality of bottom electrodes and the plurality of isolated regions of the active stack form a plurality of vertical two-terminal devices.

3. The apparatus of claim 2, further comprising an electronic backplane bonded to the plurality of vertical two-terminal devices.

4. The apparatus of claim 1, wherein the patterned substrate is disposed over a plurality of conductive lines, and wherein the plurality of elevated regions comprise a plurality of lines of a dielectric material extending perpendicularly with respect to the plurality of conductive lines.

5. The apparatus of claim 1, wherein the substrate comprises a first layer of dielectric material and a second layer of dielectric material on the first layer of dielectric material, and a plurality of undercuts in the first layer.

6. The apparatus of claim 1, wherein the patterned substrate comprises:
   a polymer selected from the group consisting of polyesters, polyimides, polyacrylates, polycarbonates, silicones, and combinations thereof; or
   a material selected from the group consisting of glass, quartz, sapphire, plastics, and combinations thereof.

7. The apparatus of claim 1, wherein the patterned substrate includes a third layer of conductive material, wherein the plurality of elevated regions are disposed on the third layer of conductive material.

8. The apparatus of claim 1, wherein the active stack comprises an organic light-emitting diode stack.

9. A system comprising:
   a display comprising:
      a plurality of diodes on a patterned substrate including two or more levels, a first layer of conductive material over the patterned substrate with a plurality of breaks forming a plurality of bottom electrodes, and a plurality of regions of an active stack, each region including a top; and
      an electronic backplane bonded to the plurality of diodes;
   a display driver to display data on the display; and
   a processor to provide data to the display driver.

10. The system of claim 9, wherein the display is a light-emitting diode display.

11. The system of claim 10, wherein the system is selected from the group consisting of an e-reader, a desktop computer, a laptop computer, a handheld computer, a tablet computer, a netbook computer, a convertible computer, a display device, a server, a set-top box, a digital recorder, a game console, a smart phone, a personal digital assistant, a mobile phone, a digital media player, a television, and a digital camera.

12. The apparatus of claim 11, wherein a second plurality of active stacks are disposed on top of the bottom electrodes on the elevated regions of the second level.

13. An apparatus comprising:
- a patterned substrate having a plurality of recessed regions at a first level and a plurality of elevated regions at a second level;
- a first layer of conductive material in the plurality of recessed regions at the first level and on the plurality of elevated regions at the second level with a break in the first layer on at least one of one or more sidewalls of each of the elevated regions forming a plurality of bottom electrodes; and
- a first plurality of active stacks disposed on top of the bottom electrodes in the recessed regions, each of the active stacks including a top electrode disposed thereon, wherein the first plurality of active stacks are isolated from each other by the plurality of elevated regions.

* * * * *